US006798657B1

(12) United States Patent
Clifton et al.

(10) Patent No.: US 6,798,657 B1
(45) Date of Patent: Sep. 28, 2004

(54) SELF-COOLING UNIT

(75) Inventors: Mark B. Clifton, West Windsor, NJ (US); Ivan Pawlenko, Holland, PA (US); Larry Samson, Langhorne, PA (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/448,586

(22) Filed: May 30, 2003

(51) Int. Cl.[7] .......................... H05K 7/20; F25D 17/06

(52) U.S. Cl. ...................... 361/691; 361/690; 454/186; 165/104.34; 62/408; 62/419; 62/426

(58) Field of Search ............................ 361/694, 695, 361/676, 678, 687, 690, 692, 691; 454/184–186; 417/197; 62/404, 407, 408, 409, 418, 419, 426; 165/58, 59, 104.11, 104.34

(56) References Cited

U.S. PATENT DOCUMENTS 1,555,349 A * 9/1925 Ballow ...................... 416/136
2,135,112 A * 11/1938 Hamond ..................... 267/70
2,664,000 A * 12/1953 Smith ......................... 62/142
4,046,492 A * 9/1977 Inglis ........................ 417/197
4,174,926 A * 11/1979 Hamrick et al. ........... 417/334
4,195,780 A * 4/1980 Inglis ......................... 239/73
4,385,728 A * 5/1983 Inglis et al. ............... 239/424
4,540,361 A * 9/1985 Gagne ........................ 432/30
5,284,473 A * 2/1994 Calabria ...................... 604/8
6,075,204 A * 6/2000 Celauro et al. ......... 174/17 GF
6,407,533 B1 * 6/2002 Bartek et al. .............. 320/150
6,537,036 B1 * 3/2003 Broerman et al. ....... 417/182.5
6,590,769 B2 * 7/2003 Hilpert et al. ............. 361/695

FOREIGN PATENT DOCUMENTS

JP 58002476 A * 1/1983 .......... F03D/11/02

* cited by examiner

*Primary Examiner*—Anatoly Vortman

(57) ABSTRACT

A cooling system that can be used, for example, for cooling electrical circuit boards housed in an equipment cabinet. The cooling system includes a flow-rate-amplifying pump configured to introduce ambient air into the cabinet. The flow-rate-amplifying pump is a passive device, which has a primary intake and a secondary intake and is designed to produce a large flow of relatively cool ambient air into the cabinet through the primary intake using a small volume of compressed air applied to the secondary intake. In one embodiment, the cooling system has an auxiliary pump driven by a windmill device. Rotation of a propeller in the windmill device is converted into piston oscillation in the auxiliary pump, which oscillation is used to compress air and apply it to the secondary intake of the flow-rate-amplifying pump. A cooling system of the invention can provide efficient cooling while being self-sustaining and generating less noise and/or electrical interference than prior art cooling systems.

12 Claims, 3 Drawing Sheets

SELF-COOLING UNIT

CROSS-REFERENCE TO RELATED APPLICATIONS

The subject matter of this application is related to that of U.S. patent application Ser. No. 10/303,378, filed Nov. 25, 2002, and entitled "Cooling Method and Apparatus," which is incorporated herein by reference.

BACKGROUND OF THE INVENTION

1. Field of the Invention

The present invention relates to cooling electrical equipment.

2. Description of the Related Art

FIGS. 1A–B schematically show, respectively, a cut-away side view of an equipment cabinet 100 of the prior art and a perspective view of an array 106 of electrical fans 108 used in cabinet 100. Cabinet 100 houses equipment components such as, for example, printed circuit boards 102 typically mounted on a rack 104. During operation, boards 102 may generate a significant amount of heat. To protect boards 102 from overheating, cabinet 100 has a cooling system including two arrays 106*a–b*, with one array placed at the top and another array at the bottom of cabinet 100. Fans 108 of arrays 106*a–b* provide cool air intake and/or hot air exhaust for cabinet 100. In a typical configuration, relatively cool ambient air is drawn into cabinet 100 by rotating blades of fans 108. The air then circulates within the cabinet before being exhausted through air vents 110 on the sides of cabinet 100. The air heats up during the circulation as it cools down boards 102. Alternatively, cabinet 100 can be connected to a heat exchanger to form a closed-loop system designed to circulate air without introducing ambient air into the system.

One problem with cabinet 100 is that each fan 108 is a source of electrical noise, which may interfere with electrical signals in boards 102. In addition, fans 108 generate mechanical noise and vibrations, which can damage the circuitry on boards 102. Furthermore, due to a relatively large number of continuously running fans in cabinet 100, it is not unusual that at least one of the fans is broken and requires repair and/or replacement.

SUMMARY OF THE INVENTION

Problems in the prior art are addressed in accordance with the principles of the invention by a cooling system that can be used, for example, for cooling electrical circuit boards housed in an equipment cabinet. The cooling system includes a flow-rate-amplifying pump configured to introduce ambient air into the cabinet. The flow-rate-amplifying pump is a passive device, which has a primary intake and a secondary intake and is designed to produce a large flow of relatively cool ambient air into the cabinet through the primary intake using a small volume of compressed air applied to the secondary intake. In one embodiment, the cooling system has an auxiliary pump driven by a windmill device. Rotation of a propeller in the windmill device is converted into piston oscillation in the auxiliary pump, which oscillation is used to compress air and apply it to the secondary intake of the flow-rate-amplifying pump. A cooling system of the invention can provide efficient cooling while being self-sustaining and less expensive, more reliable, easier to install, and generating less noise and/or electrical interference than prior art cooling systems.

According to one embodiment, the present invention is a ventilated equipment cabinet for housing and cooling heat-generating electrical equipment, comprising: (a) an enclosure adapted to house the electrical equipment and having one or more air vents; and (b) a flow-rate-amplifying pump having a primary intake, a secondary intake, and an exhaust port, wherein: the primary intake is connected to an opening in the enclosure; the secondary intake is connected to receive compressed gas from a compressed-gas supply, such that, the compressed gas induces a flow of ambient air from the primary intake to the exhaust port; the exhaust port is configured to introduce the flow into the enclosure, such that the air heats up as it cools the electrical equipment and exits the enclosure through the one or more air vents; and the compressed-gas supply comprises an auxiliary pump actuated by a windmill device.

According to another embodiment, the present invention is an apparatus adapted to ventilate the interior of an enclosure having one or more air vents, the apparatus comprising: (a) a flow-rate-amplifying pump having a primary intake, a secondary intake, and an exhaust port, wherein: the primary intake is adapted to be connected to an opening in the enclosure; the secondary intake is adapted to be connected to receive compressed gas from a compressed-gas supply, such that, the compressed gas induces a flow of ambient air from the primary intake to the exhaust port; and the exhaust port is configured to introduce the flow into the enclosure, such that the air heats up as it cools equipment housed in the enclosure and exits the enclosure through the one or more air vents; and (b) the compressed-gas supply adapted to generate the compressed gas, wherein the compressed-gas supply comprises an auxiliary pump actuated by a windmill device.

According to yet another embodiment, the present invention is a method of cooling heat-generating electrical equipment housed in a ventilated equipment cabinet, comprising applying compressed gas to a secondary intake of a flow-rate-amplifying pump, wherein: the pump has a primary intake, the secondary intake, and an exhaust port; the primary intake is connected to an opening in the enclosure; the secondary intake is connected to receive compressed gas from a compressed-gas supply, such that, the compressed gas induces a flow of ambient air from the primary intake to the exhaust port; the exhaust port is configured to introduce the flow into the enclosure such that the air heats up as it cools the electrical equipment and exits the enclosure through the one or more air vents; and the compressed-gas supply comprises an auxiliary pump actuated by a windmill device.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1B:
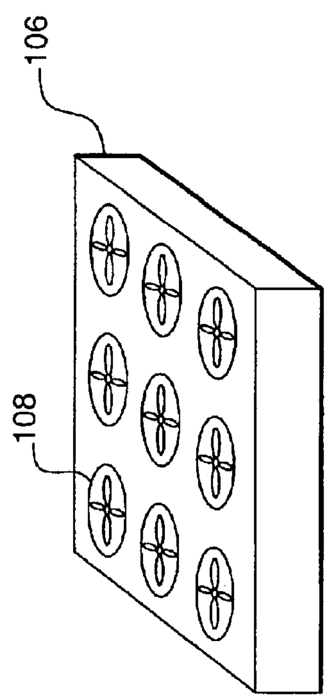
FIG. 1B schematically shows a perspective view of an array of fans used in the cabinet of FIG. 1A.
Figure 1A:
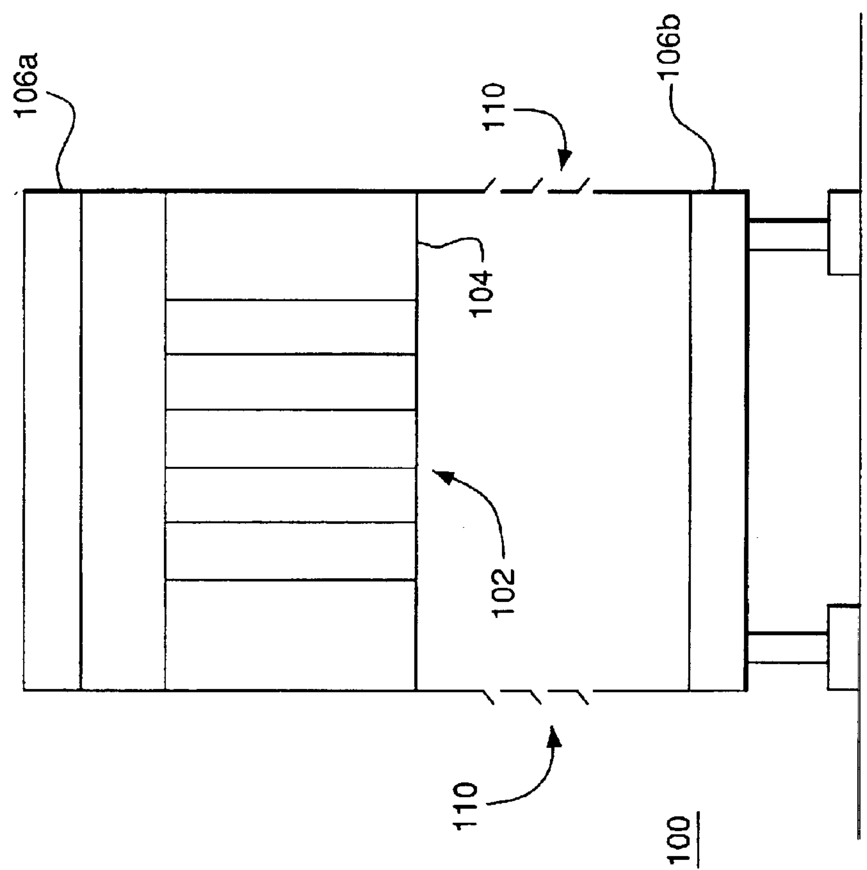
FIG. 1A schematically shows a cut-away side view of an equipment cabinet of the prior art.
Figure 2:
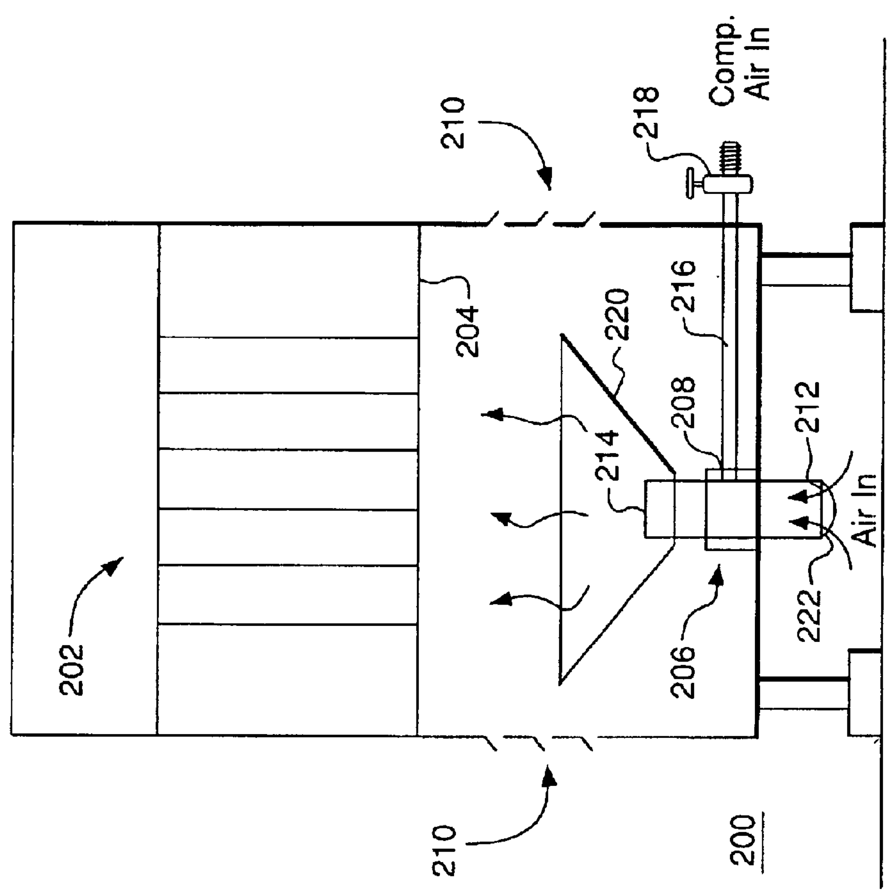
FIG. 2 schematically shows a cut-away side view of an equipment cabinet.

FIG. 2 schematically shows a cut-away side view of an equipment cabinet 200. Cabinet 200 is similar to cabinet 100 of FIG. 1. In particular, cabinet 200 has a cooling system and may house printed circuit boards 202 mounted on a rack 204. However, the cooling system of cabinet 200 is different from that of cabinet 100. For example, instead of the fan arrays used in cabinet 100, cabinet 200 has a flow-rate-amplifying pump 206 designed to operate based on the Coanda effect well known in the art of aerodynamics. More specifically, pump 206 is a passive device, which preferably does not have moving parts and is designed to produce a large flow of relatively cool ambient air from a primary intake 212 to an exhaust port 214 using a small volume of compressed air applied to the secondary intake 208. Pump 206 preferably provides a volume ratio of about 1:40 between secondary intake 208 and exhaust port 214. In one embodiment, pump 206 is a CDF-series vacuum pump model 2000H available from Vaccon Company, Inc., of Medfield, Mass. In a different embodiment, a different flow-rate-amplifying pump may be similarly used.

Pump 206 is mounted such that primary intake 212 and exhaust port 214 are located outside and inside, respectively, of cabinet 200. Ambient air is drawn into intake 212 and is exhausted through port 214 into cabinet 200, where it circulates around boards 202. The air heats up during the circulation as it cools down boards 202. The heated air is exhausted through air vents 210 on the sides of cabinet 200. In a different embodiment, the air vents can be placed above boards 202 either on the sides or on top of cabinet 200.

In one embodiment, secondary intake 208 is connected to an external compressed-air line (not shown) by an air-tight hose 216 optionally having a regulator valve 218. Primary intake 212 may be equipped with an optional air filter 222 to reduce the amount of ambient debris (e.g., dust) drawn into cabinet 200 through pump 206. Exhaust port 214 may be equipped with an optional funnel (or nozzle) 220 for better air distribution inside cabinet 200. In different embodiments, different funnel shapes may be used.

Since the cooling system of cabinet 200 does not have electrical components such as, e.g., electrical fans or motors, it may provide one or more of the following benefits over the cooling system of cabinet 100: less mechanical vibration, no electrical interference, greater reliability due to the absence of fans, and less expensive maintenance.

Figure 3:
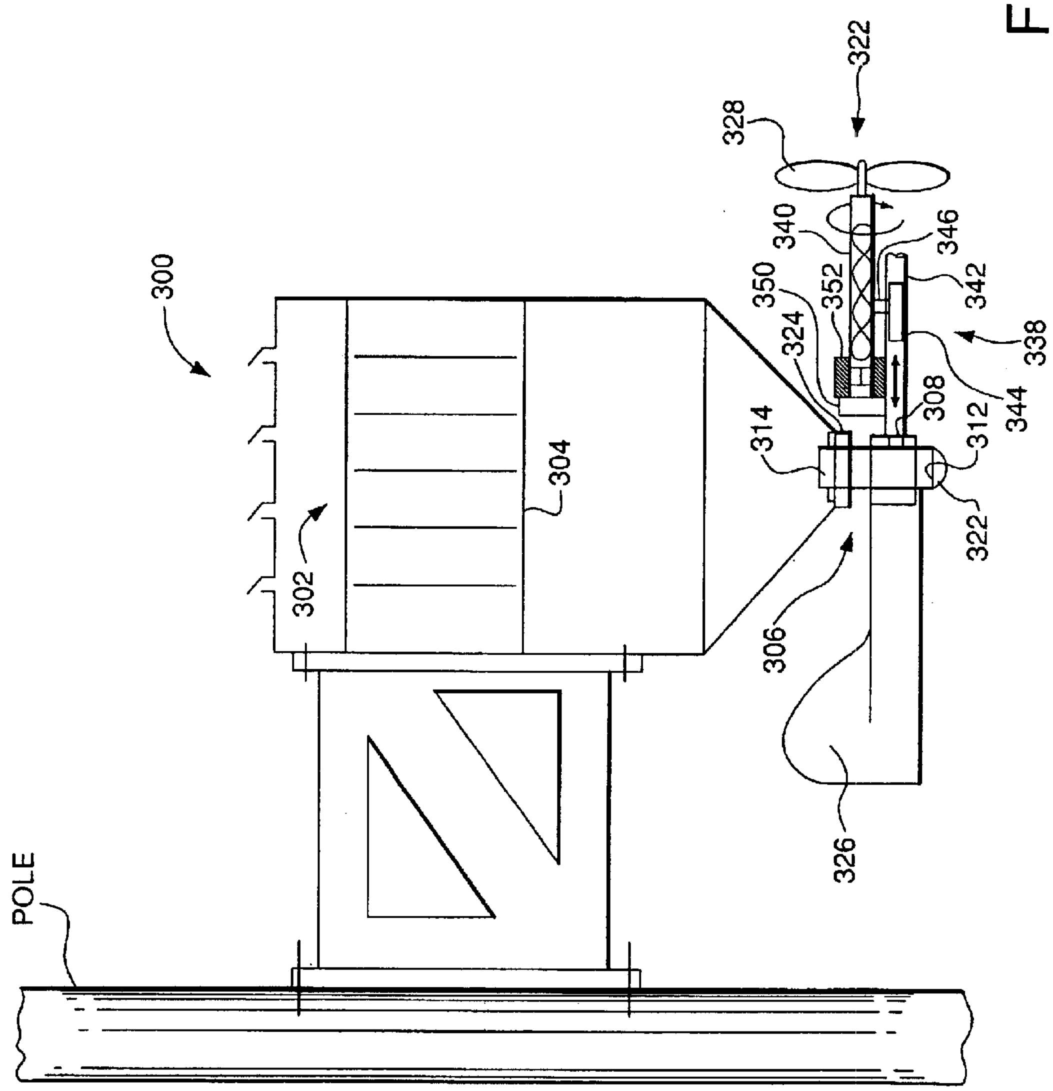
FIG. 3 schematically shows a cut-away side view of an equipment cabinet according to one embodiment of the present invention.

FIG. 3 schematically shows a cut-away side view of an equipment cabinet 300 according to one embodiment of the present invention. Cabinet 300 is similar to cabinet 200 of FIG. 2 and may house printed circuit boards 302 mounted on a rack 304. The cooling system of cabinet 300 has a flow-rate-amplifying pump 306, which is similar to pump 206 and has a primary intake 312, an exhaust port 314, a secondary intake 308, and an optional air filter 322. However, one difference between cabinets 300 and 200 is in the manner in which compressed air for secondary intake 308 is generated. More specifically, instead of using compressed air from an external line as in cabinet 200, cabinet 300 has an auxiliary pump 338 configured to compress ambient air and apply it to intake 308. Auxiliary pump 338 is coupled to a windmill device 322 configured to provide a driving force for said pump. As such, cabinet 300 is preferably an outdoor unit that may be mounted on a pole or building side exposed to wind.

In one embodiment, windmill device 322 comprises a swivel 324, a fin 326, and a propeller 328, all connected to pump 306. Swivel 324 is attached between the housing of cabinet 300 and pump 306 such that pump 306 together with fin 326, pump 338, and propeller 328 can rotate about a vertical axis with respect to the housing. Fin 326 serves to align propeller 328 with the wind direction. More specifically, wind acts upon the sides of fin 326, which applies torque to pump 306 and rotates the pump together with windmill device 322 to orient the (preferably horizontal) axis of rotation of propeller 328 parallel to the wind direction. The wind also causes propeller 328 to rotate and thereby to drive pump 338.

In one embodiment, pump 338 comprises a camshaft 340, a piston assembly 342, and a camshaft follower 346 coupled between the camshaft and a piston 344 of the piston assembly. Camshaft 340 has a spiral track designed to convert rotation of the camshaft into translation of camshaft follower 346. More specifically, the spiral track has two spiral portions of opposite chirality connected to each other at the ends. When camshaft 340 is continuously rotated in one direction, camshaft follower 346 is pushed by this rotation along the spiral track such that: (i) when the camshaft follower is in the first spiral portion, it is pushed in the corresponding direction (e.g., left in FIG. 3) along the camshaft; (ii) when the camshaft follower reaches the end of the first spiral portion, it transfers into the second spiral portion; (iii) when the camshaft follower is in the second spiral portion, it is pushed in the opposite direction (e.g., right in FIG. 3) along the camshaft; and (vi) when the camshaft follower reaches the end of the second spiral portion, it transfers into the first spiral portion. As a result, rotation of camshaft 340 causes camshaft follower 346 to move along the camshaft back and forth between two terminal positions. This motion will cause piston 344 attached to camshaft follower 346 to oscillate between two terminal positions within piston assembly 342, which has a one-way valve and is similar to a bicycle pump, thereby enabling the air-pumping action of pump 338. In the cooling system of cabinet 300, camshaft 340 of pump 338 is coupled to propeller 328 such that rotation of the propeller produces rotation of the camshaft, which, in turn, causes pump 338 to pump air into intake 308 of pump 306.

In an alternative embodiment, instead of or in addition to pump 338, the cooling system of cabinet 300 may have an optional battery 350 and an optional small electrical generator/motor 352 coupled to propeller 328 or a different propeller and configured to drive pump 338. When the propeller is rotated by the wind, the generator produces electricity, which is used to charge the battery. In one configuration, electrical generator/motor 352 and battery 350 may be used as a backup power system for pump 338, e.g., for use under windless conditions.

Cabinet 300 is preferably installed in areas where winds are relatively strong and occur relatively often. The applicants' own tests demonstrated that, when exposed to sufficient amount of wind, the cooling system of cabinet 300 is capable of generating adequate cooling for boards 302 while generating less electrical interference than the cooling system of cabinet 100. In addition, the cooling system of cabinet 300 is self-sustaining, more reliable than that of cabinet 100, and may be relatively inexpensive to maintain.

While this invention has been described with reference to illustrative embodiments, this description is not intended to be construed in a limiting sense. Although the invention was described in reference to equipment cabinets containing circuit boards, it may also be used with other enclosures containing different heat-radiating devices. Different components of a cooling system of the invention may be variously placed relative to each other without departing from the principles of the invention. Different mechanical and/or electrical pumps driven by a windmill device may be used to apply compressed air to pump 306. Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A ventilated equipment cabinet for housing and cooling heat-generating electrical equipment, comprising:

(a) an enclosure adapted to house the electrical equipment and having one or more air vents; and (b) a flow-rate-amplifying pump having a primary intake, a secondary intake, and an exhaust port, wherein:

the primary intake is connected to an opening in the enclosure;

the secondary intake is connected to receive compressed gas from a compressed-gas supply, such that, the compressed gas induces a flow of ambient air from the primary intake to the exhaust port;

the exhaust port is configured to introduce the flow into the enclosure, such that the air heats up as it cools the electrical equipment and exits the enclosure through the one or more air vents; and the compressed-gas supply comprises an auxiliary pump actuated by a windmill device.

2. The invention of claim 1, wherein:

the windmill device is connected to the flow-rate-amplifying pump; and the flow-rate-amplifying pump is rotatably connected to the enclosure and adapted to rotate with respect to the enclosure in response to airflow about the windmill device.

3. The invention of claim 2, wherein the windmill device comprises a fin and a propeller, both connected to the flow-rate-amplifying pump, wherein, in response to the airflow, the fin applies torque to the flow-rate-amplifying pump to orient a rotation axis of the propeller substantially parallel to the direction of the airflow.

4. The invention of claim 2, wherein the flow-rate-amplifying pump is connected to the enclosure using a swivel.

5. The invention of claim 1, wherein the auxiliary pump comprises:

a piston assembly coupled to the secondary intake; and a rotatable camshaft, wherein rotation of the camshaft generates oscillation of a piston in the piston assembly between two terminal positions thereby producing the compressed gas.

6. The invention of claim 5, wherein the auxiliary pump further comprises a camshaft follower attached to the piston and inserted into a spiral track of the camshaft, wherein the rotation of the camshaft pushes the camshaft follower along the spiral track thereby producing the oscillation of the piston.

7. The invention of claim 1, wherein the auxiliary pump is an electrical pump configured to be powered by electricity generated by the windmill device.

8. The invention of claim 7, wherein the electrical pump is configured to be powered by a battery charged by the electricity.

9. The invention of claim 1, wherein the cabinet is mounted to be exposed to wind.

10. The invention of claim 1, wherein the electrical equipment is a part of a base station of a wireless communication system.

11. An apparatus adapted to ventilate the interior of an enclosure having one or more air vents, the apparatus comprising:

(a) a flow-rate-amplifying pump having a primary intake, a secondary intake, and an exhaust port, wherein:

the primary intake is adapted to be connected to an opening in the enclosure;

the secondary intake is adapted to be connected to receive compressed gas from a compressed-gas supply, such that, the compressed gas induces a flow of ambient air from the primary intake to the exhaust port; and the exhaust port is configured to introduce the flow into the enclosure, such that the air heats up as it cools equipment housed in the enclosure and exits the enclosure through the one or more air vents; and (b) the compressed-gas supply adapted to generate the compressed gas, wherein the compressed-gas supply comprises an auxiliary pump actuated by a windmill device.

12. A method of cooling heat-generating electrical equipment housed in a ventilated equipment cabinet, comprising applying compressed gas to a secondary intake of a flow-rate-amplifying pump, wherein:

the pump has a primary intake, the secondary intake, and an exhaust port;

the primary intake is connected to an opening in the enclosure;

the secondary intake is connected to receive compressed gas from a compressed-gas supply, such that, the compressed gas induces a flow of ambient air from the primary intake to the exhaust port;

the exhaust port is configured to introduce the flow into the enclosure, such that the air heats up as it cools the electrical equipment and exits the enclosure through the one or more air vents; and the compressed-gas supply comprises an auxiliary pump actuated by a windmill device.

* * * * *